United States Patent
Ayranci et al.

(10) Patent No.: US 12,149,213 B2
(45) Date of Patent: Nov. 19, 2024

(54) WIDEBAND MULTI GAIN LNA ARCHITECTURE

(71) Applicant: Murata Manufacturing Co., Ltd., Kyoto (JP)

(72) Inventors: Emre Ayranci, Costa Mesa, CA (US); Mengsheng Rui, San Diego, CA (US); Jubaid Qayyum, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 585 days.

(21) Appl. No.: 17/337,227

(22) Filed: Jun. 2, 2021

(65) Prior Publication Data
US 2022/0393650 A1 Dec. 8, 2022

(51) Int. Cl.
  *H03F 3/193* (2006.01)
  *H03F 1/56* (2006.01)
  *H04B 1/40* (2015.01)

(52) U.S. Cl.
  CPC ............ *H03F 1/565* (2013.01); *H03F 3/193* (2013.01); *H03F 2200/294* (2013.01); *H03F 2200/387* (2013.01); *H03F 2200/451* (2013.01); *H04B 1/40* (2013.01)

(58) Field of Classification Search
  CPC .... H03F 1/565; H03F 3/193; H03F 2200/294; H03F 2200/387; H03F 2200/451; H03F 2200/492; H03F 1/223; H04B 1/40
  USPC ........................................................ 330/296
  See application file for complete search history.

(56) References Cited

U.S. PATENT DOCUMENTS

| | | | | |
|---|---|---|---|---|
| 6,249,186 B1 * | 6/2001 | Ebihara | .................. | H01L 23/66 330/277 |
| 6,882,226 B2 * | 4/2005 | Cho | ...................... | H03G 1/007 330/278 |
| 7,764,125 B2 * | 7/2010 | Dawe | ..................... | H03F 3/193 330/305 |

(Continued)

OTHER PUBLICATIONS

Lee, Thomas H., "The Design of CMOS Radio-Frequency Integrated Circuits", Second Edition, Cambridge University Press, Section 9.2, 2004, 7 pgs.
(Continued)

*Primary Examiner* — Andrea Lindgren Baltzell
*Assistant Examiner* — Khiem D Nguyen
(74) *Attorney, Agent, or Firm* — JAQUEZ LAND GREENHAUS & McFARLAND LLP; John Land, Esq.

(57) ABSTRACT

Circuits and methods for a multi-gain mode amplifier, particularly an LNA, that achieves wideband output impedance matching and high gain while maintaining low power and a low NF in a highest gain mode, and which can switch to one or more lower gain modes that achieve higher linearity with lower power. In a highest gain mode, an inductor is selectively inserted between the amplified-signal terminal of an amplification core and an output LC output matching network. The inductor, when inserted, provides wideband output impedance matching, functioning as a series peaking inductor; accordingly, the inserted inductor delays current flow to the output capacitor and lowers the rise time of signal changes across the output capacitor. In addition, higher gain can be achieved compared to a conventional LC output impedance matching topology due to a higher impedance at the amplified-signal terminal of the amplification core.

22 Claims, 11 Drawing Sheets

(56) References Cited

U.S. PATENT DOCUMENTS

| | | | | |
|---|---|---|---|---|
| 8,018,288 B2* | 9/2011 | Duster | .................. | H03F 1/0255 |
| | | | | 330/306 |
| 8,461,929 B2* | 6/2013 | Yamamoto | .............. | H03F 3/193 |
| | | | | 330/310 |
| 9,231,536 B2* | 1/2016 | Descios | .................. | H03F 3/211 |
| 9,929,701 B1* | 3/2018 | Noori | ..................... | H03G 3/008 |
| 2001/0045867 A1* | 11/2001 | Miyashita | ................. | H03F 3/19 |
| | | | | 333/214 |
| 2012/0280754 A1* | 11/2012 | Gorbachov | ............. | H03F 1/565 |
| | | | | 330/302 |
| 2014/0240048 A1* | 8/2014 | Youssef | .................. | H03F 3/245 |
| | | | | 330/296 |

OTHER PUBLICATIONS

Ikalainen, Pertti K., "An RLC Matching Network and Application in 1-20 GHZ Monolithic Amplifier", 1989 IEEE MTT-S Digest, pp. 1115-1118.

* cited by examiner

WIDEBAND MULTI GAIN LNA ARCHITECTURE

BACKGROUND

(1) Technical Field

The invention relates to electronic circuits, and more particularly to radio frequency amplifier circuits.

(2) Background

Many modern electronic systems include radio frequency (RF) receivers; examples include personal computers, tablet computers, wireless network components, televisions, cable system "set top" boxes, radar systems, and cellular telephones. Many RF receivers are paired with RF transmitters in the form of transceivers, which often are quite complex two-way radios. In some cases, RF transceivers are capable of transmitting and receiving across multiple frequencies in multiple bands.

Amplifiers are a common component in RF transmitters, receivers, and transceivers, and are frequently used for power amplification of transmitted RF signals and for low-noise amplification of received RF signals. For many RF systems, particularly those requiring low power and/or portability (e.g., cellular telephones, WiFi-connected computers, cameras, and other devices), it has become common to use complementary metal-oxide semiconductor (CMOS) fabrication technology to create low cost, low power integrated circuits (ICs). CMOS devices include bulk CMOS, silicon-on-insulator (SOI) CMOS, and silicon-on-sapphire (SOS) CMOS (SOS being a type of SOI fabrication technology).

FIG. 1 is a simplified schematic diagram of a generalized embodiment of a prior art low-noise amplifier (LNA) circuit 100. The LNA circuit 100 includes an amplifier block 102 comprising a stack of two series-connected FETs $M_{CS}$, $M_{CG}$ in a cascode arrangement. An RF input signal applied to an RF input terminal $RF_{IN}$ may be passed through an impedance matching circuit 104 and coupled to the gate of the common-source lower FET $M_{CS}$. The source of lower FET $M_{CS}$ is typically connected through a degeneration inductor $L_{DEG}$ to a reference potential, such as circuit ground.

The source of the common-gate upper FET $M_{CG}$ is connected to the drain of lower FET $M_{CS}$. The drain of upper FET $M_{CG}$ provides an amplified RF output signal through a DC blocking capacitor C1 to an RF output terminal $RF_{OUT}$. Capacitor C1 may also provide output matching. An inductor L1 is connected between a source voltage $V_{DD}$ and the drain of upper FET $M_{CG}$ to provide load matching and a bias feed to the amplifier block 102. In the illustrated example, the RF output terminal $RF_{OUT}$ is shown coupled to a typical 50 ohm load, represented as a resistor.

A bias circuit 106 is configured to provide a suitable bias voltage $CG\_V_{BIAS}$ to the common-gate upper FET $M_{CG}$ and a suitable bias voltage $CS\_V_{BIAS}$ to the common-source lower FET $M_{CS}$, in known fashion. Additional well-known circuit elements that might be included in some applications, such as DC block capacitors, additional impedance matching circuitry, and additional filters, are omitted for clarity.

Important desired characteristics of an LNA are high gain with low noise, a wide bandwidth, good linearity, and good output impedance matching. Accordingly, four important design parameters for LNAs are gain, noise figure (NF), input-referenced third intercept point (IIP3), and output reflection coefficient. NF is a measure of degradation of the signal-to-noise ratio (SNR) caused by components in a signal chain, with lower values indicating better performance. IIP3 is a figure of merit representing amplifier linearity, with higher values indicating better performance. In general, NF has a stricter specification requirement in high-gain modes than in low gain-modes, while IIP3 has a stricter specification requirement in low-gain modes than in high-gain modes. The output reflection coefficient is the S22 scattering parameter (or "S-parameter") and is an indication of output impedance matching, with lower (more negative, when evaluated logarithmically) numbers indicating better impedance matching.

Increases in the frequency of RF communications bands and channels, as well as a continuing increase in the number of bands and channels in use, has pushed current LNA architectures to their limits. For example, achieving stringent requirements for gain, percentage bandwidth, linearity, and output impedance matching with a traditional LNA architecture is not possible for some of the new 5G mobile network bands, particularly in 3 to 6 GHz NR bands, upcoming 7-24 GHz bands, and the millimeter wave range (e.g., 24.25 GHz to 52.6 GHz).

For instance, in the LNA architecture shown in FIG. 1, output impedance matching is through a single-stage LC output impedance matching circuit comprising L1 and C1. However, this single-stage LC architecture has tradeoff limitations: either narrowband output impedance matching at high gain, or wider-band output impedance matching at lower gain (e.g., by reducing the Q-factor of the LC architecture).

It is known to use multi-stage output impedance matching to enable a wider-band output impedance match at a reasonably high gain. For example, FIG. 2 is a simplified schematic diagram of a generalized embodiment of a prior art LNA circuit 200 having a two-stage LC output impedance matching circuit 202. Similar in most aspects to the LNA circuit 100 of FIG. 1, the LNA circuit 200 of FIG. 2 includes a two-stage LC output impedance matching circuit 202 comprising a second inductor L2 connected in parallel to the first stage L1-C1 output matching and connected between $V_{DD}$ and a node between C1 and C2, followed by a second series connected output capacitor C2. However, while having a wider-band output impedance matching characteristic compared to the LNA circuit 100 of FIG. 1, the resulting LNA circuit 200 still does not achieve the high gain required for 5G mobile network bands and other high-frequency applications. Further, the increased circuitry of the two-stage LC output impedance matching circuit 202 hurts linearity due to loss at the output impedance match. That is, compared to single-stage LC output matching, to achieve the same gain, the voltage swing at the drain of common-gate FET $M_{CG}$ must be larger to compensate the loss in two-stage LC output matching, which hurts linearity.

Accordingly, there is a need for an LNA architecture that overcomes these limitations of conventional LNA architectures.

SUMMARY

The present invention provides circuits and methods for a multi-gain mode LNA that achieves wideband output impedance matching and high gain while maintaining low power and a low NF in a highest gain mode, and which can switch to one or more lower gain modes that achieve higher linearity with even lower power. The inventive circuits and methods may also be applied to other types of amplifiers, such as power amplifiers.

In a highest gain mode, an inductor is selectively inserted between the amplified-signal terminal of an LNA amplification core and an output LC output matching network. The inductor, when inserted, provides wideband output impedance matching because the inductor acts as a series peaking inductor. In essence, the presence of the inductor delays current flow to the output capacitor and lowers the rise time of signal changes across the output capacitor. In addition, higher gain can be achieved compared to a conventional LC output impedance matching topology due to a higher impedance at the amplified-signal terminal of the amplification core.

In greater detail, one embodiment includes an amplifier including: an amplifier core including an input terminal configured to receive a radio-frequency (RF) signal, and an amplified-signal terminal; an output capacitor; a multi-mode inductor circuit coupled to the amplified-signal terminal and to the output capacitor at a node, the multi-mode inductor circuit including a first inductor and a bypass switch coupled in parallel with the first inductor; and an impedance matching and bias circuit configured to be coupled to a source voltage and coupled to the output capacitor at the node, the impedance matching and bias circuit including a second inductor; wherein in a first high gain mode of operation, the bypass switch is in an open state, thereby coupling the first inductor between the amplified-signal terminal and the node; and wherein in a first low gain mode of operation, the bypass switch is in a closed state, thereby bypassing the first inductor and coupling the amplified-signal terminal to the node.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention provides circuits and methods for a multi-gain mode LNA that achieves wideband output impedance matching and high gain while maintaining low power and a low NF in a highest gain mode, and which can switch to one or more lower gain modes that achieve higher linearity with even lower power. The inventive circuits and methods may also be applied to other types of amplifiers, such as power amplifiers.

Figure 3A:
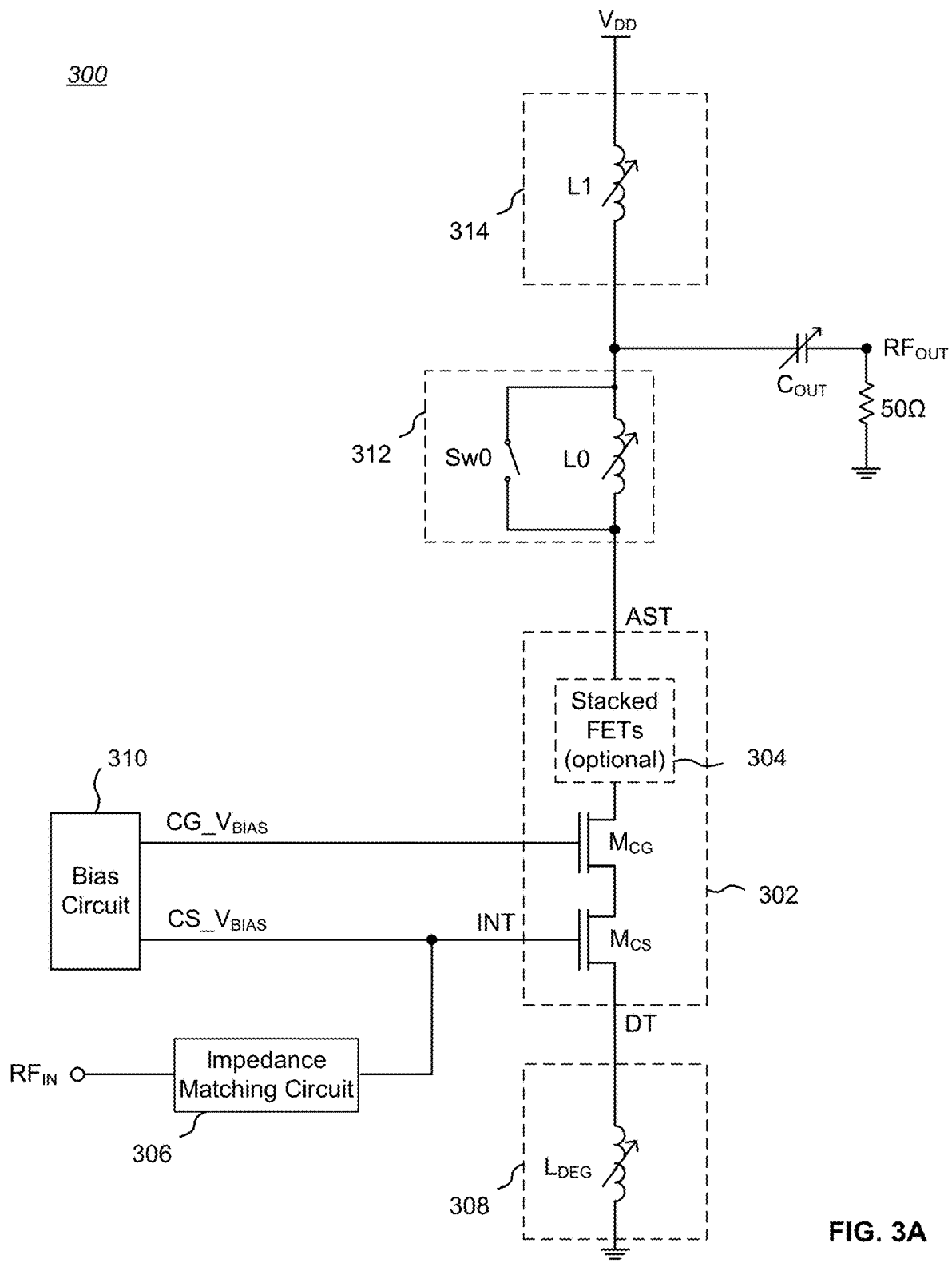
FIG. 3A is a simplified schematic diagram of a first embodiment of a wideband multi-gain LNA circuit in accordance with the present invention.

FIG. 3A is a simplified schematic diagram of a first embodiment of a wideband multi-gain LNA circuit 300 in accordance with the present invention. Additional well-known circuit elements that might be included in some applications, such as DC block capacitors, additional impedance matching circuitry, and additional filters, are omitted for clarity. Note also that a circuit component that is characterized as "adjustable" may have its value selected from a number of possible component value settings and fixed during fabrication, when assembled in a circuit module, during factory testing, or in the field (e.g., by burning or "blowing" fusible links), or may have its value be dynamically varied, tuned, or programmatically set, such as in response to other circuitry (e.g., temperature compensation circuitry) or in response to generated or received command signals.

The multi-gain LNA circuit 300 includes an amplification core 302 that includes a common-source FET $M_{CS}$ and a common-gate FET $M_{CG}$ in a cascode configuration. Accordingly, the gate of the common-source FET $M_{CS}$ may be regarded as an input terminal INT of the amplification core 302, the source of the common-source FET $M_{CS}$ may be regarded as a degeneration terminal DT of the amplification core 302, and the drain of the common-gate FET $M_{CG}$ may be regarded as an amplified-signal terminal AST of the amplification core 302. In some embodiments, in order to overcome a relatively low breakdown voltage per CMOS FET, multiple common-gate FETS may be series-coupled in a FET stack 304 between the drain of the bottom-most common-gate FET $M_{CG}$ and the amplified-signal terminal AST—that is, the amplification core 302 may have multiple series-coupled common-gate FETs in a cascode configuration. The amplified-signal terminal AST would then be the drain of the upper-most common-gate FET in the amplification core 302.

An RF input signal applied to an RF input terminal $RF_{IN}$ is coupled to an input impedance matching circuit 306. The output of the input impedance matching circuit 306 is coupled to the input terminal INT of the amplification core 302. In various embodiments, one or both of inductors $L_{SER}$, $L_{SH}$ may be fixed or adjustable (see, for example, FIG. 3B). The physical size of inductors $L_{SER}$, $L_{SH}$ needed for a particular application is generally frequency dependent. For example, inductors $L_{SER}$, $L_{SH}$ may be off-chip with respect to an IC embodiment of the multi-gain LNA circuit 300, particularly for RF frequencies at or below about 3 GHz, and for RF frequencies at or above about 8 GHz, inductors $L_{SER}$, $L_{SH}$ may be on-chip.

The degeneration terminal DT is typically coupled thorough a degeneration circuit 308 to a reference potential, such as circuit ground. In some embodiments, the degeneration circuit 308 may comprise an adjustable degeneration inductor $L_{DEG}$, such as a multiport integrated circuit inductor coil. An adjustable degeneration inductor $L_{DEG}$ may be used to improve linearity in low gain modes. For example, a smaller value for the degeneration inductor $L_{DEG}$ may be used in a high gain mode or modes, and a larger value for the degeneration inductor $L_{DEG}$ may be used in a low gain mode or modes.

A bias circuit 310 is configured to provide a suitable bias voltage $CG\_V_{BIAS}$ to the common-gate FET $M_{CG}$ and a suitable bias voltage $CS\_V_{BIAS}$ to the common-source FET $M_{CS}$, in known fashion.

In the illustrated example, the amplified-signal terminal AST is coupled to a first terminal of a multi-mode inductor circuit 312 comprising an inductor L0 coupled in parallel with a bypass switch Sw0. Inductor L0 may be adjustable, as shown, or have a fixed value. A second terminal of the multi-mode inductor circuit 312 is coupled to a first terminal of an output capacitor $C_{OUT}$, which may be adjustable, as shown, or have a fixed value. A second terminal of the output capacitor $C_{OUT}$ is coupled to an output terminal $RF_{OUT}$. The output capacitor $C_{OUT}$ provides DC blocking and output impedance matching for loads coupled to the output terminal $RF_{OUT}$. In the illustrated example, the output terminal $RF_{OUT}$ is shown coupled to a typical 50 ohm load, represented as a resistor.

An impedance matching and bias circuit 314 is coupled between a source voltage $V_{DD}$ and the first terminal of the output capacitor $C_{OUT}$ to provide output impedance matching and a bias feed to the amplification core 302. In the illustrated example, the impedance matching and bias circuit 314 includes an inductor L1, which may be adjustable, as shown, or have a fixed value.

Basic Modes of Operation

With the architecture shown in FIG. 3A, the multi-gain LNA circuit 300 enables multiple gain modes. In the highest gain mode, switch Sw0 is set to an OPEN (non-conducting) state. Accordingly, inductor L0 is connected between the amplified-signal terminal AST of the amplification core 302 and the first terminal of the output capacitor $C_{OUT}$. Thus, the output capacitor $C_{OUT}$ is connected to a node between inductor L1 and inductor L0.

In the highest gain mode, having inductor L0 inserted between the amplified-signal terminal AST and the output capacitor $C_{OUT}$ provides wideband output impedance matching because inductor L0 acts as a series peaking inductor. In essence, the presence of inductor L0 delays current flow to the output capacitor $C_{OUT}$ and lowers the rise time of signal changes at the amplified-signal terminal AST when unit step input is applied. The fall time of signal changes at the amplified-signal terminal AST when unit step input is applied are similarly affected. In addition, higher gain can be achieved compared to the simple L1-C1 output impedance matching topology of the LNA circuit 100 of FIG. 1 due to a higher impedance at the amplified-signal terminal AST (i.e., the drain of the cascode stack in the amplification core 302).

If inductor L0 is adjustable, additional high gain modes (of course, less than the highest gain modes) are available as the inductance of inductor L0 is reduced from its highest available level, but at the expense of somewhat narrower bandwidth. In some types of adjustable inductors, a lowest inductance state is equivalent to the inductor being bypassed—in essence, such adjustable inductors have a built-in switch Sw0.

In a first low gain mode, switch Sw0 is set to a CLOSED (conducting) state, thus bypassing inductor L0. Consequently, inductor L1 and output capacitor $C_{OUT}$ form a conventional LC output impedance matching circuit. Since there is less loss in the load circuit compared to the highest gain mode (inductor L0 having been effectively cut out of the output circuitry), to achieve the same gain as the highest gain mode. there will be less voltage swing at the amplified-signal terminal AST, which leads to better linearity for the multi-gain LNA circuit 300. If inductor L1 is adjustable, additional low gain modes are available as the inductance of inductor L1 is varied to meet output impedance matching requirements.

Making inductors L0 and L1 both adjustable—particularly dynamically adjustable, as by programmatic control—enables tradeoffs among gain, output matching bandwidth, and linearity by invoking different gain modes.

Enhanced Embodiments

The basic embodiment shown in FIG. 3A may be further improved by enhancing certain subs-circuits and/or adding additional circuitry. For example, FIG. 3B is a schematic diagram of a second embodiment of a wideband enhanced multi-gain LNA circuit 350 in accordance with the present invention.

A. Enhanced Impedance Matching and Bias Circuit

An enhanced multi-gain LNA circuit 350 may include an enhanced impedance matching and bias circuit 314'. In the illustrated example, the enhanced impedance matching and bias circuit 314' includes an inductor L1 (which may be adjustable, as shown, or have a fixed value). In parallel with inductor L1 is a selectable resistance path that includes at least one of a resistor R1 in series with a switch Sw1, and/or a selectable capacitance path that includes a capacitor C1 in series with a switch Sw2. Resistor R1 and/or capacitor C1 may be adjustable, as shown, or have fixed values. Closing switch Sw1 enables resistor R1 to have an effect on the operation of the enhanced multi-gain LNA circuit 350, and closing switch Sw2 enables capacitor C1 to have an effect on the operation of the enhanced multi-gain LNA circuit 350. Tunability for resistor R1 enables gain reduction and provides wider bandwidth by "de-Q'ing" the inductor L1 (i.e., reducing the Q-factor of inductor L1). Tunability for capacitor C1 enables better output matching in low gain modes.

Figure 3B:
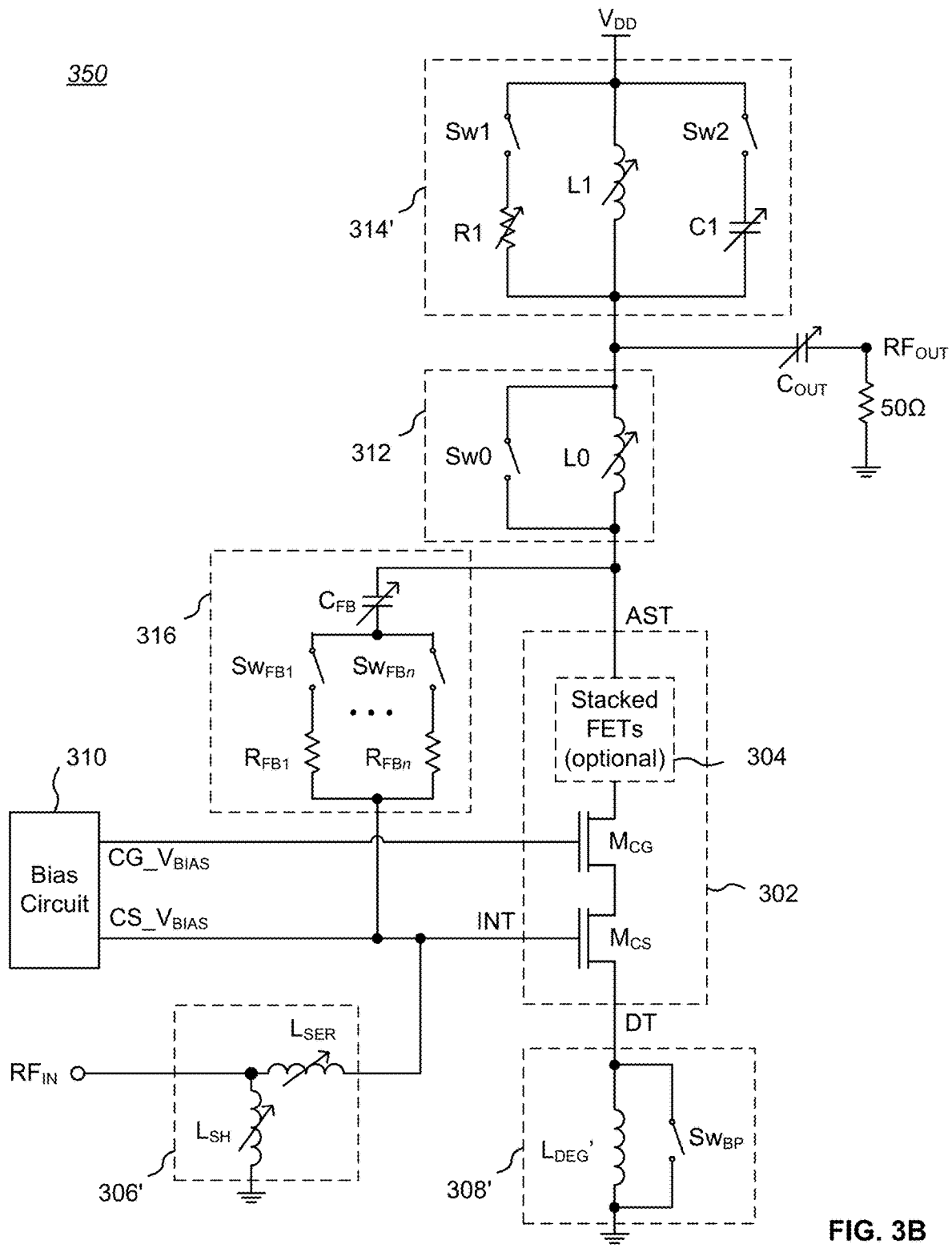
FIG. 3B is a schematic diagram of a second embodiment of a wideband enhanced multi-gain LNA circuit in accordance with the present invention.

With the architecture shown in FIG. 3B, the multi-gain LNA circuit 350 enables more gain modes than the multi-gain LNA circuit 300 of FIG. 3A. In the highest gain mode, switches Sw0, Sw1, and Sw2 are set to an OPEN (non-conducting) state. Accordingly, inductor L0 is connected between the amplified-signal terminal AST of the amplification core 302 and the first terminal of the output capacitor $C_{OUT}$. Thus, the output capacitor $C_{OUT}$ is connected to a node between inductor L1 and inductor L0. In the highest gain mode, the enabled (in-circuit) presence of inductor L0 provides wideband output impedance matching. If inductor L0 is adjustable, additional high gain modes (of course, less than the highest gain modes) are available as the inductance of inductor L0 is reduced from its highest available level.

In a first low gain mode, switch Sw0 is set to a CLOSED (conducting) state, thus bypassing inductor L0. Accordingly, inductor L1 and output capacitor $C_{OUT}$ form a conventional LC output impedance matching circuit. If inductor L1 is adjustable, additional low gain modes are available as the inductance of inductor L1 is varied to meet output impedance matching requirements.

In addition, further low gain modes are available by setting switches Sw1 and/or Sw2 to a CLOSED state, thereby connecting resistor R1 and/or capacitor C1 in parallel with inductor L1. In the lowest gain mode, both switches Sw1 and Sw2 are set to a CLOSED state. If resistor R1 and/or capacitor C1 are adjustable, additional intermediate low gain modes are available as the resistance of R1 and/or the capacitance of C1 are varied to meet output impedance matching requirements. For example, adjusting R1 may be used to reduce the gain of the multi-gain LNA circuit 350 to extend the bandwidth of the circuit.

B. Wideband Input Impedance Matching

An enhanced multi-gain LNA circuit 350 may include an enhanced input impedance matching circuit 306' comprises a series-connected inductor $L_{SER}$ and a shunt-connected inductor $L_{SH}$, as illustrated. Thus, the series-connected inductor $L_{SER}$ is coupled between the RF input terminal $RF_{IN}$ and the input terminal INT of the amplification core 302, and the shunt-connected inductor $L_{SH}$ is coupled between the series-connected inductor $L_{SER}$ and a reference potential (e.g., circuit ground). In alternative embodiments, the shunt-connected inductor $L_{SH}$ may be placed on the other side of the series-connected inductor $L_{SER}$ rather than on the input terminal side (noting that if the order of connections changes, there may be different input matching bandwidth and noise figure tradeoffs). The series-shunt inductors $L_{SER}$, $L_{SH}$ of the enhanced input impedance matching circuit 306, together with the common source FET $M_{CS}$ coupled to the degeneration circuit 308, form a doubly-terminated bandpass filter which increases the input bandwidth of the multi-gain LNA circuit 350.

C. Enhanced Degeneration Circuit & Feedback Circuit

An enhanced multi-gain LNA circuit 350 may include an enhanced degeneration circuit 308' comprising a simple two-port degeneration inductor $L_{DEG}'$ and a bypass switch Swim, coupled in parallel with the degeneration inductor $L_{DEG}'$. In preferred embodiments, the two-port degeneration inductor $L_{DEG}'$ comprises an IC inductor coil having an input port IN and only a single output port OUT. This simplified configuration of the two-port degeneration inductor $L_{DEG}$ results in less inductive and capacitive coupling compared to multi-port inductor coils, which would improve the quality factor of $L_{DEG}'$. The overall inductor value is also reduced—for example, using similar IC design rules in generally similar LNA circuit designs, the total inductance of the two-port degeneration inductor $L_{DEG}'$ may be less than half of the total inductance of multi-port inductor coils in many applications. The simplified configuration also eliminates several switches compared to the prior art, thus reducing the IC "real estate" required for the enhanced degeneration circuit 308'.

With a multiport degeneration inductor and switch configuration in conventional designs, in a high-gain mode, a switch is in the signal path, resulting in additional noise. With the enhanced degeneration circuit 308', eliminating the need for any switch being in the signal path reduces noise, thereby further increasing the performance of the multi-gain LNA circuit 350.

Reducing inductive and capacitive coupling provides a new design tradeoff: a simple two-port inductor coil can be made physically smaller than a prior-art multi-port coil but retain about the same Q value, or can be made about the same size as a prior-art multi-port coil but with an increase in the Q value of the inductor (of course, intermediate sizes can be selected to tradeoff between physical size and Q value). IC "real estate" reduction occurs even if the coil for the two-port degeneration inductor $L_{DEG}$ is made physically the same size as a prior-art multi-port coil, since the necessary output port switches are eliminated. A multi-port coil also increases design complexity and requires more programming to control the switches coupled to the various output ports.

The combination of the common source FET $M_{CS}$ coupled to the enhanced degeneration circuit 308' and the series-shunt inductors $L_{SER}$, $L_{SH}$ of the enhanced input impedance matching circuit 306' form a doubly-terminated bandpass filter which increases the bandwidth of the multi-gain LNA circuit 350.

An enhanced multi-gain LNA circuit 350 may include a feedback circuit 316 as shown in FIG. 3B. The feedback circuit 316 is shown coupled between the input terminal INT and the amplified-signal terminal AST. More generally, the feedback circuit 316 may be coupled to a feedback node in the output signal path of the amplification core 302, which may be the drain of any of the FETS in the amplification core 302. The choice of feedback node for connection to the feedback circuit 316 may be made, for example, based on different desired feedback strength and different desired input impedance.

The feedback circuit 316 in the illustrated embodiment comprises a capacitor $C_{FB}$ series-coupled to one or more parallel feedback switches $Sw_{FB1}$ ... $Sw_{FBn}$ (generically, $Sw_{FBx}$), which in turn are series-coupled to respective parallel feedback resistor(s) $R_{FRB1}$ ... $R_{FBn}$ (generically, $R_{FBx}$). In some embodiments, capacitor $C_{FB}$ may be adjustable, as shown, or have a fixed value. With n parallel switch/resistor branches, the tunability of the feedback resistors $R_{FBx}$ is equal to 2n (the total number of switching combinations). Note that the values of the feedback resistors $R_{FBx}$ need not be identical.

Capacitor $C_{FB}$, the set of feedback switches $Sw_{FBx}$, and the set of feedback resistors $R_{FBx}$ may be connected in any series order in other embodiments. In alternative embodiments, a single feedback switch may be used in combination with an adjustable or fixed feedback resistor. In still other embodiments, the feedback switch may be omitted, thereby permanently coupling the feedback resistors $R_{FBx}$ between the input terminal INT and a feedback node in the output signal path of the amplification core 302.

In various gain modes, the feedback circuit 316 may be enabled such that one or more feedback resistors $R_{FBx}$ are coupled between the input terminal INT and a feedback node in the output signal path of the amplification core 302, such as be closing a corresponding feedback switch or switches $Sw_{FBx}$. In such gain modes, capacitor $C_{FB}$ provides DC blocking functionality, and operates in conjunction with enabled feedback resistors $R_{FBx}$ as a filter. The presence of the enabled feedback resistors $R_{FBx}$ allows the Q-factor of the input impedance matching to be reduced, which increases the bandwidth of the enhanced multi-gain LNA circuit 350 at the expense of gain and NF. The feedback circuit 316 may be disabled by opening all feedback switches $Sw_{FBx}$.

An advantage of using a variable or multi-state feedback circuit 316 is that multiple resistance values enable multiple gain modes. For instance, LNAs in mobile RF receiver devices need multiple gain modes depending upon the range of input signal strength at the receiver. In addition, enabling multiple gain modes by using variable or multi-state feedback resistors $R_{FBx}$ may eliminate the need for an output attenuator (common in conventional receiver LNAs).

For example, during operation in a low-gain mode, in which IIP3 is generally the more important parameter to emphasize, the bypass switch $Sw_{BP}$ of the enhanced degeneration circuit 308' is set to a CLOSED state, thereby coupling the degeneration terminal DT (i.e., the source of the FET $M_{CS}$) to circuit ground and bypassing the degeneration inductor $L_{DEG}'$ entirely. Concurrently, one or more feedback switches $Sw_{FBx}$ are set to a CLOSED state, which enables the feedback circuit 316. The resistance provided by the feedback circuit 316 lowers the input impedance of the FET $M_{CS}$ and reduces the gain of the enhanced multi-gain LNA circuit 350, essentially eliminating the need for a degeneration inductor. In embodiments having multiple low-gain modes, the resistance of the feedback resistors $R_{FBx}$ and/or the capacitance of capacitor $C_{FB}$ may be programmatically varied to tune the feedback circuit 316 to better match a gain level and/or for better input impedance matching.

During operation in a high-gain mode, in which NF is generally the more important parameter to emphasize, the bypass switch $Sw_{BP}$ is set to an OPEN state, thereby coupling degeneration terminal DT to circuit ground through the degeneration inductor $L_{DEG}$; that is, the degeneration inductor $L_{DEG}$ is in the signal path from the source of FET $M_{CS}$ to circuit ground. Concurrently, if input impedance matching bandwidth can be achieved by $L_{SER}$ and $L_{SH}$, the feedback switches $Sw_{FBx}$ may be opened, disabling the feedback circuit 316. In this mode of operation, the presence of the degeneration inductor $L_{DEG}$ instead of the feedback circuit 316 helps provide a relatively better noise figure NF, achieves high sensitivity with low power consumption, and helps with impedance matching at the input terminal INT.

In some embodiments, the enhanced multi-gain LNA circuit 350 may have multiple high-gain and low-gain modes and the states of the bypass switch $Sw_{BP}$ and the feedback switches $Sw_{FBx}$, along with the resistance setting(s) for the feedback resistors $R_{FBx}$, may be independently controlled to provide the best IIP3 and NF performance for a selected gain mode. For example, for a particular high-gain mode (not the highest gain mode), feedback switch $Sw_{FB1}$ may be CLOSED, bypass switch $Sw_{BP}$ may be OPEN, and a value may be selected for feedback resistor $R_{FB1}$ to match a selected gain level and input impedance.

Similarly, in a particular low-gain mode (not the lowest gain mode), feedback switch $Sw_{FB1}$ may be CLOSED, bypass switch $Sw_{BP}$ may be OPEN, and a value may be selected for feedback resistor $R_{FB1}$ to match a selected gain level and input impedance.

Thus, gain modes between the highest and lowest gain modes may be supported in which the switch states of the feedback switches $Sw_{FBx}$ and the bypass switch $Sw_{BP}$ may not coincide, with the value(s) of the resistors $R_{FBx}$ providing another control variable.

It should be appreciated that the inventive architecture provides a great deal of flexibility in setting amplifier circuit component values and component states in order to achieve a variety of performance goals. For example, it may be that noise factor and input impedance matching in a maximum gain mode are to be emphasized. In that case, the degeneration inductor $L_{DEG}'$ generally should not be bypassed (by opening the bypass switch $Sw_{BP}$) and the feedback circuit 316 should be disabled (by opening the feedback switch $Sw_{FB}$).

In other cases, it may be that linearity (IIP3) in a maximum gain mode is to be emphasized. In that case, the degeneration inductor $L_{DEG}'$ generally should be bypassed (by closing the bypass switch $Sw_{BP}$) and the feedback circuit 316 should be enabled (by closing a feedback switch $Sw_{FBx}$) and set to a relatively high resistance state. In addition, appropriate bias levels for the amplification core 302 may be selected to ensure that the input impedance matching meets required specifications for the maximum gain mode.

As another example, for multiple mid-level gain modes requiring high linearity (better IIP3), the degeneration inductor $L_{DEG}'$ generally should be bypassed and the feedback circuit 316 should be enabled and set to a corresponding resistance state.

As yet another example, for a minimum gain mode requiring high linearity (better IIP3) where a higher noise factor is not a concern, the degeneration inductor $L_{DEG}'$ generally should be bypassed and the feedback circuit 316 should be enabled and set to its lowest resistance state.

Yet another control variable is mode-dependent input impedance matching. Impedance matching at the input terminal INT of the amplification core 302 is a function of the resistance provided by the feedback circuit 316 and the bias condition of the amplification core 302. A particular resistance setting for the feedback circuit 316 and appropriate voltage levels for CG_Vbias and CS_Vbias can be selected to make sure the gain level and the input impedance matching for the amplification core 302 meets required specifications for particular gain modes. The selected resistance settings and corresponding bias voltage levels for particular gain modes may be, for example, stored in a look-up table in the control circuit for the amplifier.

T-Coil Embodiments

Figure 4:
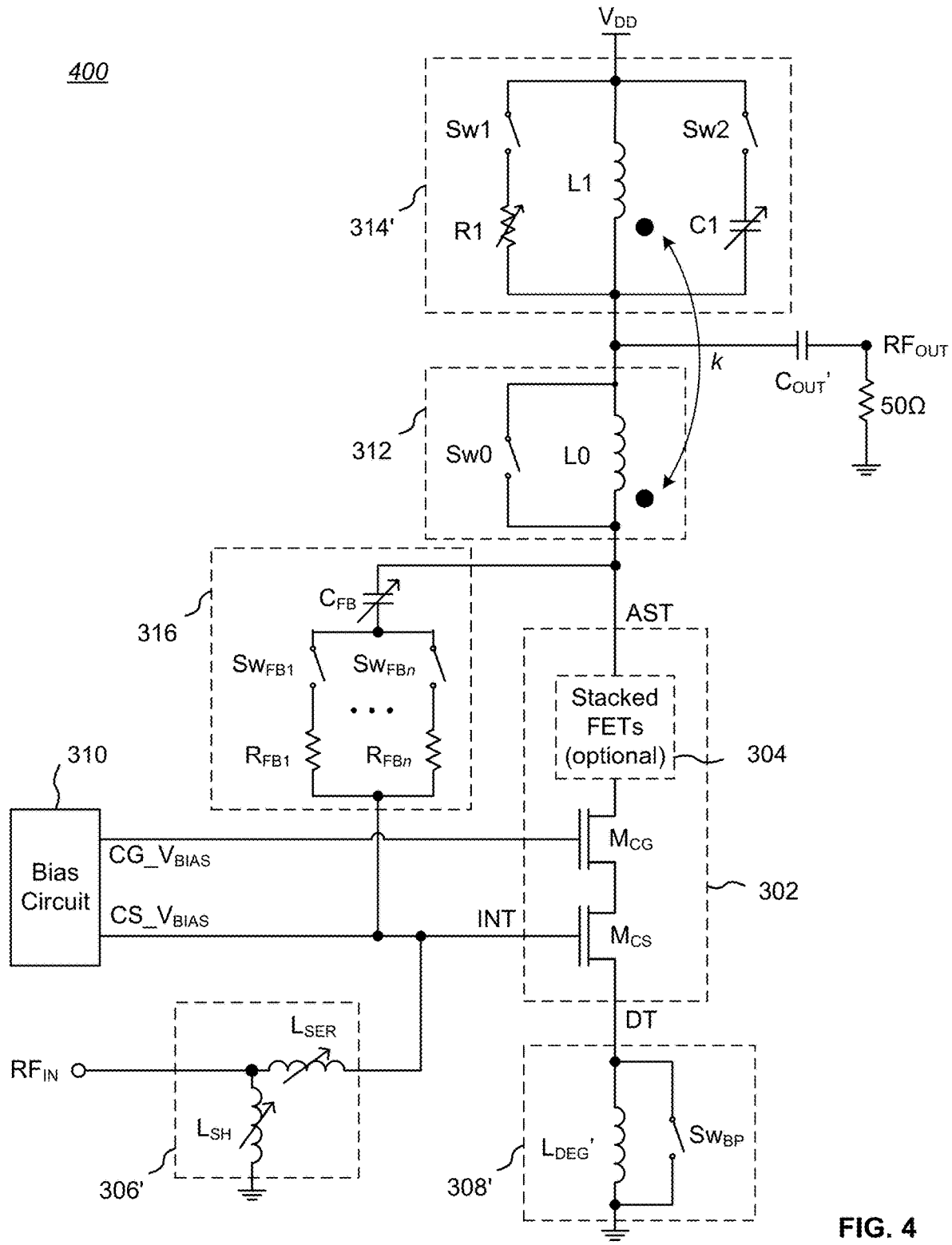
FIG. 4 is a schematic diagram of a third embodiment of a wideband enhanced multi-gain LNA circuit in accordance with the present invention.

FIG. 4 is a schematic diagram of a third embodiment of a wideband enhanced multi-gain LNA circuit 400 in accordance with the present invention. Similar in most aspects to the enhanced multi-gain LNA circuit 350 of FIG. 3B, the enhanced multi-gain LNA circuit 400 implements inductors L0 and L1 as an asymmetric T-coil, indicated by the dots adjacent L0 and L1 joined by an arrow k. An asymmetric T-coil is a special form of an inductive peaking circuit that can extend an amplifier's bandwidth and speed up the output signal rise-time. As is known, an asymmetric T-coil includes series-coupled inductors (equivalent to L0 and L1) and a small bridging capacitor across the inductors. Integrated circuit implementation may be in the form of a three-tap spiral inductor structure, in which a first portion of the spiral (from an input tap to a mid-tap) corresponds to L0, and a second portion of the spiral (from the mid-tap to an output tap) corresponds to L1.

Since a T-coil inherently includes a bridging capacitor, the value of the output capacitor may need to be adjusted compared to the value of the output capacitor in the enhanced multi-gain LNA circuit 350 of FIG. 3B. Accordingly, FIG. 4 designates the output capacitor as $C_{OUT}'$.

An advantage in using an asymmetric T-coil for inductors L0 and L1 is that IC implementation as of a three-tap spiral inductor structure saves area in comparison to separate inductors.

Performance Comparisons

LNAs in accordance with the present invention achieve wideband output impedance matching and high gain while maintaining low power and a low NF in a highest gain mode, and which can switch to one or more lower gain modes that achieve higher linearity. A comparison of the circuit architectures shown in FIGS. 1, 2, and 3B show the advantages of the present invention over conventional designs.

Figure 1:
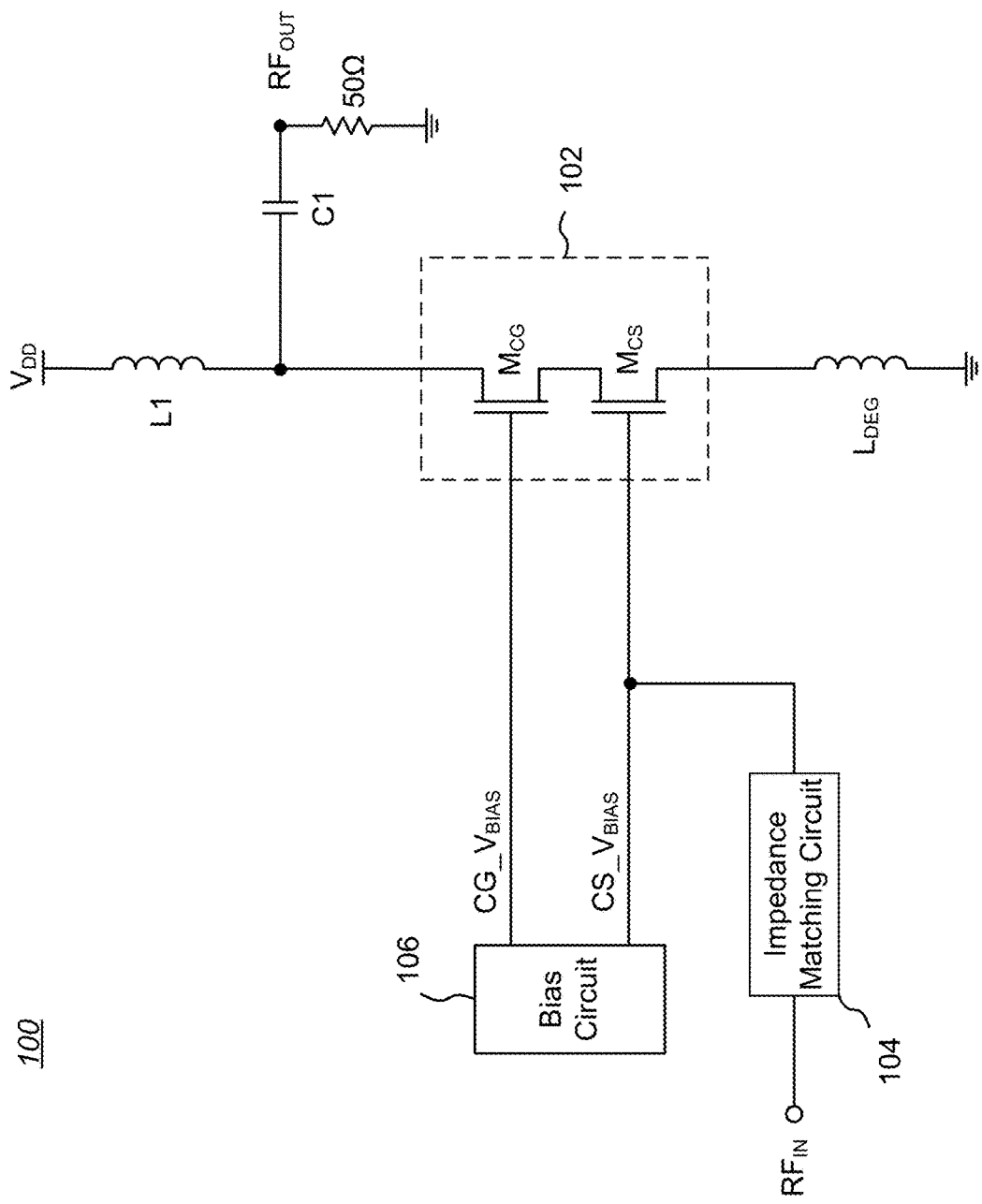
FIG. 1 is a simplified schematic diagram of a generalized embodiment of a prior art low-noise amplifier (LNA) circuit.
Figure 2:
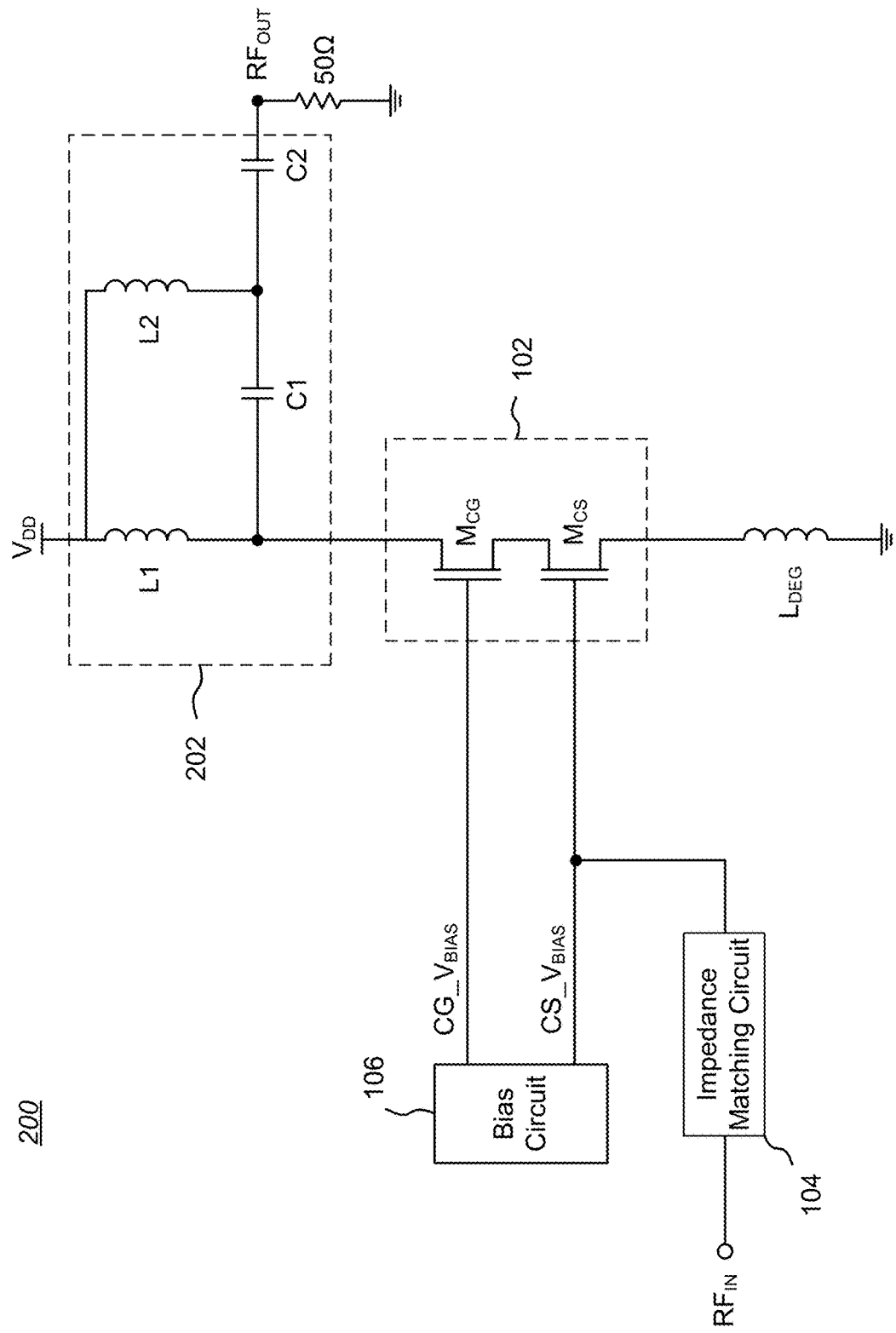
FIG. 2 is a simplified schematic diagram of a generalized embodiment of a prior art LNA circuit having a two-stage LC output impedance matching circuit.
Figure 5:
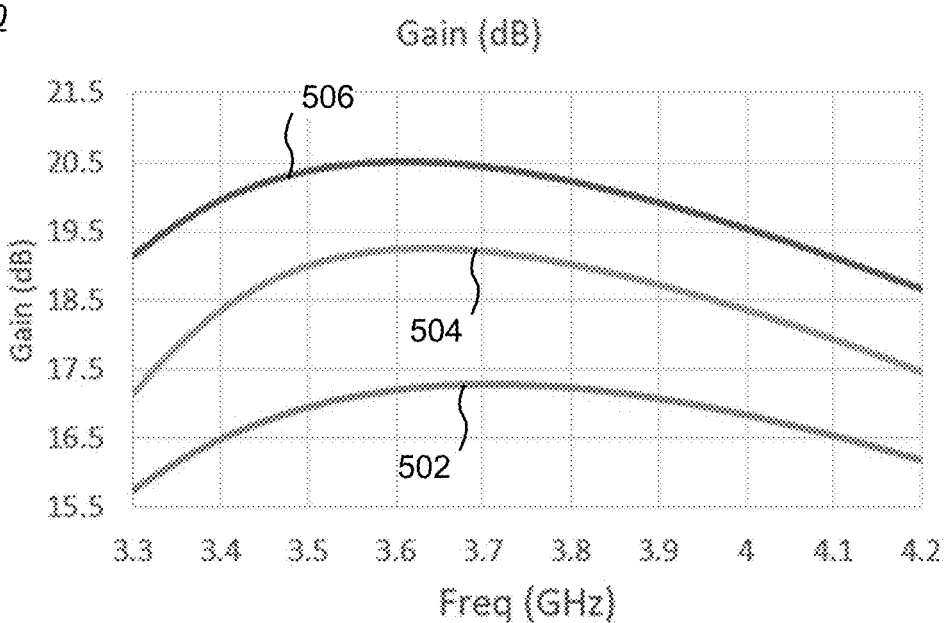
FIG. 5 is a graph of gain as a function of frequency for modeled circuit architectures like those shown in FIGS. 1, 2, and 3B.

For example, FIG. 5 is a graph 500 of gain as a function of frequency for modeled circuit architectures like those shown in FIGS. 1, 2, and 3B. Graph line 502 shows the gain performance of a conventional single-stage LC design like the architecture shown in FIG. 1. Graph line 504 shows the gain performance of a conventional two-stage LC design like the architecture shown in FIG. 2. Graph line 506 shows the gain performance of an embodiment of the novel architecture shown in FIG. 3B, which indicates higher gain than the conventional designs while still having a relatively flat gain characteristic.

Figure 6:
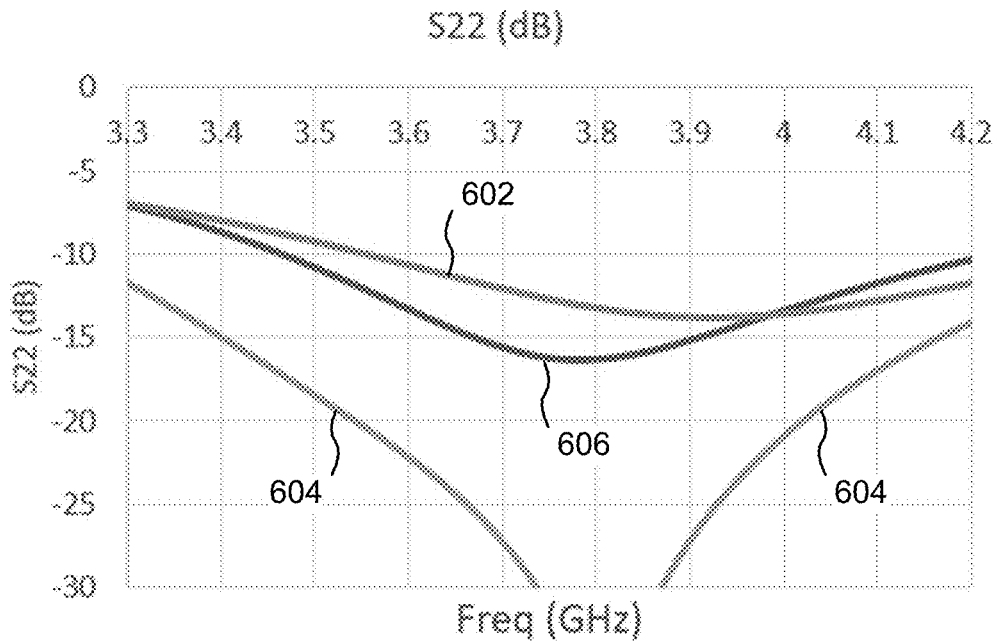
FIG. 6 is a graph of the S22 S-parameter as a function of frequency for modeled circuit architectures like those shown in FIGS. 1, 2, and 3B.

FIG. 6 is a graph 600 of the S22 S-parameter as a function of frequency for modeled circuit architectures like those shown in FIGS. 1, 2, and 3B. Graph line 602 shows the S22 S-parameter of a conventional single-stage LC design like the architecture shown in FIG. 1. Graph line 604 shows the S22 S-parameter of a conventional two-stage LC design like the architecture shown in FIG. 2. Graph line 606 shows the S22 S-parameter of an embodiment of the novel architecture shown in FIG. 3B. The output matching performance of the embodiment of the novel architecture shown in FIG. 3B generally exceeds the conventional single-stage LC design, and is sufficient to meet the needs of 5G mobile network band LNAs.

Figure 7:
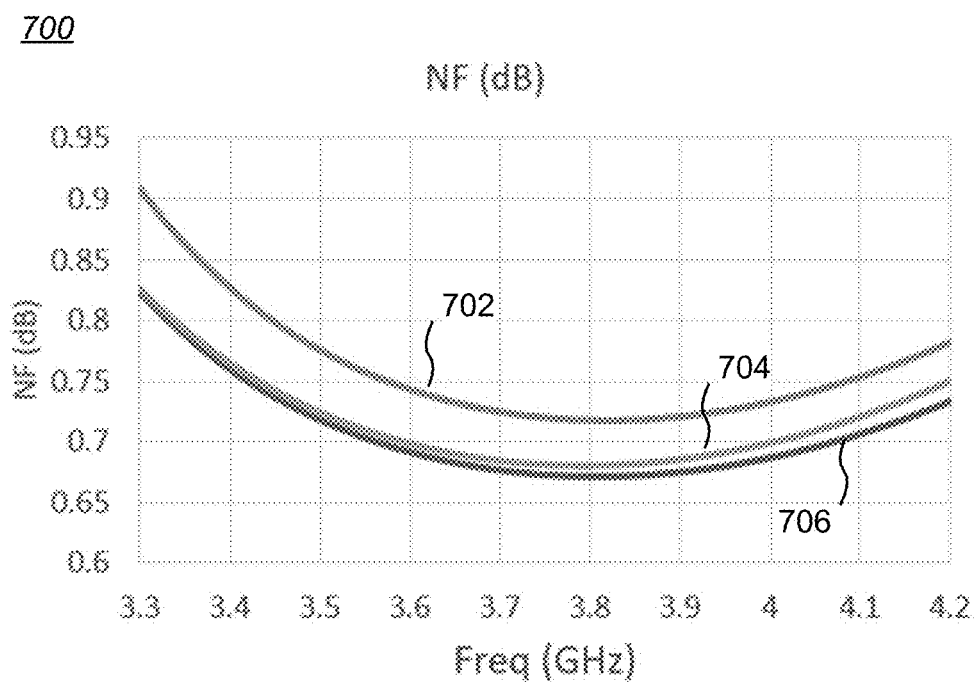
FIG. 7 is a graph of the NF performance as a function of frequency for modeled circuit architectures like those shown in FIGS. 1, 2, and 3B.

FIG. 7 is a graph 700 of the NF performance as a function of frequency for modeled circuit architectures like those shown in FIGS. 1, 2, and 3B. Graph line 702 shows the NF performance of a conventional single-stage LC design like the architecture shown in FIG. 1. Graph line 704 shows the NF performance of a conventional two-stage LC design like the architecture shown in FIG. 2. Graph line 706 shows the NF performance of an embodiment of the novel architecture shown in FIG. 3B, which indicates better NF performance than the conventional designs.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 8:
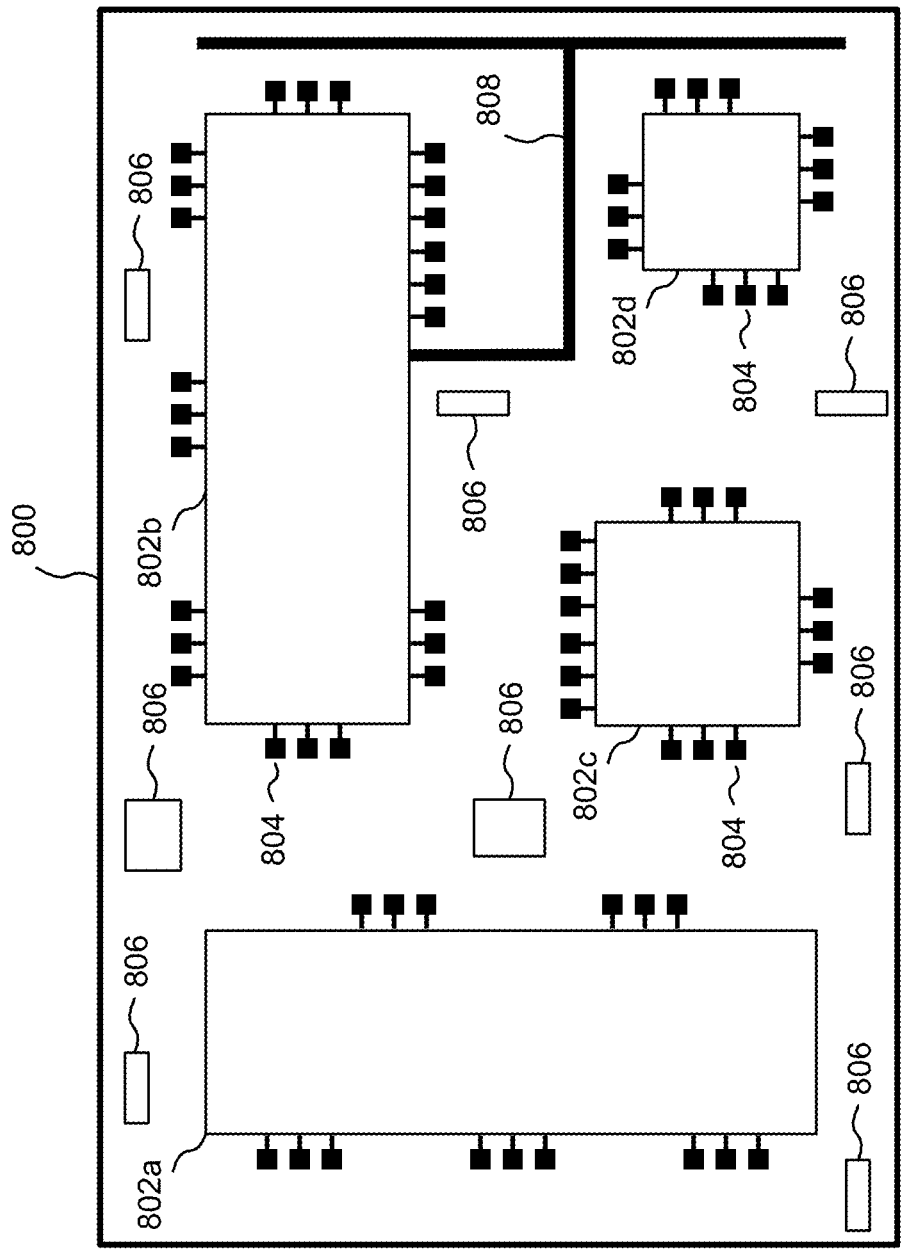
FIG. 8 is a top plan view of a substrate that may be, for example, a printed circuit board or chip module substrate (e.g., a thin-film tile).

As one example of further integration of embodiments of the present invention with other components, FIG. 8 is a top plan view of a substrate 800 that may be, for example, a printed circuit board or chip module substrate (e.g., a thin-film tile). In the illustrated example, the substrate 800 includes multiple ICs 802a-802d having terminal pads 804 which would be interconnected by conductive vias and/or traces on and/or within the substrate 800 or on the opposite (back) surface of the substrate 800 (to avoid clutter, the surface conductive traces are not shown and not all terminal pads are labelled). The ICs 802a-802d may embody, for example, signal switches, active filters, amplifiers (including one or more LNAs), and other circuitry. For example, IC 802b may incorporate one or more instances of a multi-gain LNA circuit like the circuits 300, 350, and/or 400 shown in FIGS. 3A, 3B, and 4.

The substrate 800 may also include one or more passive devices 806 embedded in, formed on, and/or affixed to the substrate 800. While shown as generic rectangles, the passive devices 806 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 800 to other passive devices 806 and/or the individual ICs 802a-802d.

The front or back surface of the substrate 800 may be used as a location for the formation of other structures. For example, one or more antennae may be formed on or affixed to the front or back surface of the substrate 800; one example of a front-surface antenna 808 is shown, coupled to an IC die 802b, which may include RF front-end circuitry. Thus, by including one or more antennae on the substrate 800, a complete radio may be created.

System Aspects

Embodiments of the present invention are useful in a wide variety of larger radio frequency (RF) circuits and systems, such as personal computers, tablet computers, wireless network components, televisions, cable system "set top" boxes, radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 9:
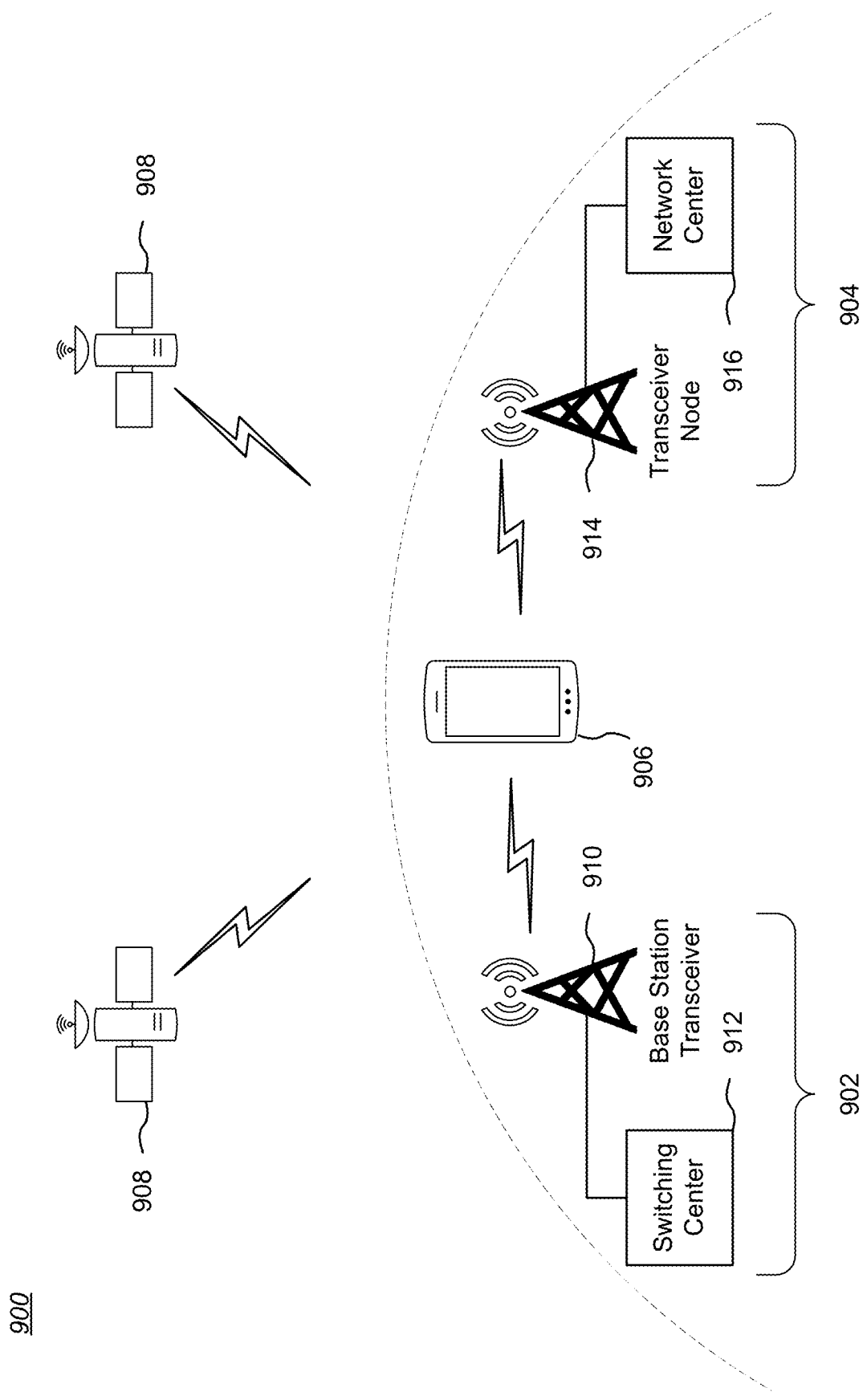
FIG. 9 illustrates an exemplary prior art wireless communication environment comprising different wireless communication systems, and may include one or more mobile wireless devices.

As an example of wireless RF system usage, FIG. 9 illustrates an exemplary prior art wireless communication environment 900 comprising different wireless communication systems 902 and 904, and may include one or more mobile wireless devices 906.

A wireless device 906 may be capable of communicating with multiple wireless communication systems 902, 904 using one or more of the telecommunication protocols noted above. A wireless device 906 also may be capable of communicating with one or more satellites 908, such as navigation satellites (e.g., GPS) and/or telecommunication satellites. The wireless device 906 may be equipped with multiple antennas, externally and/or internally, for operation on different frequencies and/or to provide diversity against deleterious path effects such as fading and multipath interference. A wireless device 906 may be a cellular phone, a personal digital assistant (PDA), a wireless-enabled computer or tablet, or some other wireless communication unit or device. A wireless device 906 may also be referred to as a mobile station, user equipment, an access terminal, or some other terminology.

The wireless system 902 may be, for example, a CDMA-based system that includes one or more base station transceivers (BSTs) 910 and at least one switching center (SC) 912. Each BST 910 provides over-the-air RF communication for wireless devices 906 within its coverage area. The SC 912 couples to one or more BSTs in the wireless system 902 and provides coordination and control for those BSTs.

The wireless system 904 may be, for example, a TDMA-based system that includes one or more transceiver nodes 914 and a network center (NC) 916. Each transceiver node 914 provides over-the-air RF communication for wireless devices 906 within its coverage area. The NC 916 couples to one or more transceiver nodes 914 in the wireless system 904 and provides coordination and control for those transceiver nodes 914.

In general, each BST 910 and transceiver node 914 is a fixed station that provides communication coverage for wireless devices 906, and may also be referred to as base stations or some other terminology. The SC 912 and the NC 916 are network entities that provide coordination and control for the base stations and may also be referred to by other terminologies.

Figure 10:
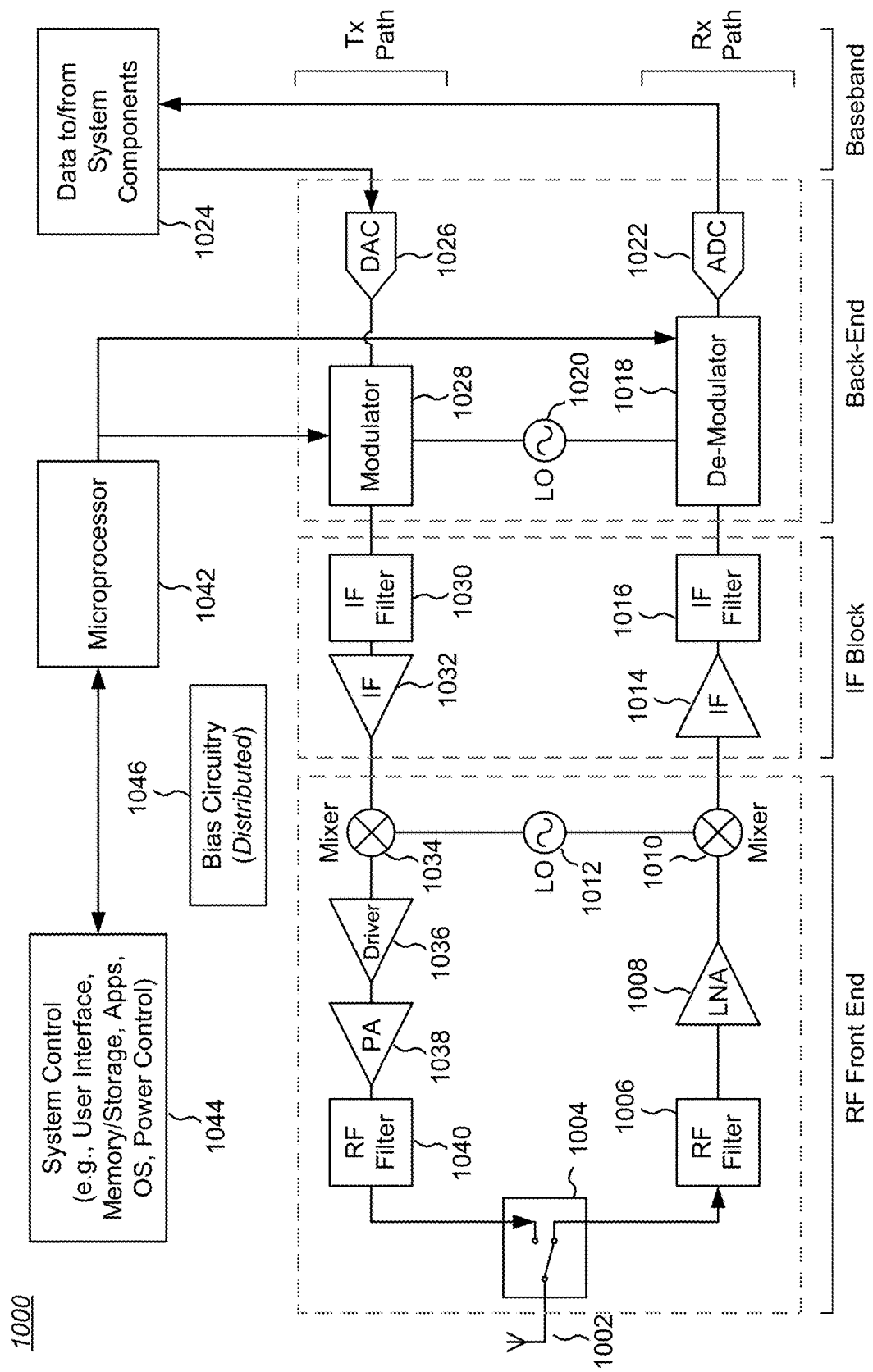
FIG. 10 is a block diagram of a transceiver that might be used in a wireless device, such as a cellular telephone, and which may beneficially incorporate an embodiment of the present invention for improved performance.

An important aspect of any wireless system, including the systems shown in FIG. 9, is in the details of how the component elements of the system perform. FIG. 10 is a block diagram of a transceiver 1000 that might be used in a wireless device, such as a cellular telephone, and which may beneficially incorporate an embodiment of the present invention for improved performance. As illustrated, the transceiver 1000 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 1002 and a switching unit 1004, which may be implemented with active switching devices (e.g., field effect transistors or FETs), or with passive devices that implement frequency-domain multiplexing, such as a diplexer or duplexer. An RF filter 1006 passes desired received RF signals to a low noise amplifier (LNA) 1008, the output of which is combined in a mixer 1010 with the output of a first local oscillator 1012 to produce an intermediate frequency (IF) signal. The LNA 1008 beneficially may be one of the types shown in FIG. 3A, 3B, or 4.

The IF signal may be amplified by an IF amplifier 1014 and subjected to an IF filter 1016 before being applied to a demodulator 1018, which may be coupled to a second local oscillator 1020. The IF amplifier 1014 beneficially may be one of the types shown in FIG. 3A, 3B, or 4. The demodulated output of the demodulator 1018 is transformed to a digital signal by an analog-to-digital converter 1022 and provided to one or more system components 1024 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1024 is transformed to an analog signal by a digital-to-analog converter 1026, the output of which is applied to a modulator 1028, which also may be coupled to the second local oscillator 1020. The modulated output of the modulator 1028 may be subjected to an IF filter 1030 before being amplified by an IF amplifier 1032, which beneficially may be one of the types shown in FIG. 3A, 3B, or 4. The output of the IF amplifier 1032 is then combined in a mixer 1034 with the output of the first local oscillator 1012 to produce an RF signal. The RF signal may be amplified by a driver 1036, the output of which is applied to a power amplifier (PA) 1038, which beneficially may be one of the types shown in FIG. 3A, 3B, or 4. The amplified RF signal may be coupled to an RF filter 1040, the output of which is coupled to the antenna 1002 through the switching unit 1004.

The operation of the transceiver 1000 is controlled by a microprocessor 1042 in known fashion, which interacts with system control components (e.g., user interfaces, memory/storage devices, application programs, operating system software, power control, etc.). In addition, the transceiver 1000 will generally include other circuitry, such as bias circuitry 1046 (which may be distributed throughout the transceiver 1000 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1000 may be positioned in a different order (e.g., filters) or omitted. Other components can be (and usually are) added (e.g., additional filters, impedance matching networks, variable phase shifters/attenuators, power dividers, etc.).

As a person of ordinary skill in the art will understand, an RF system architecture is beneficially impacted by the current invention in critical ways, including wideband output impedance matching and high gain while maintaining low power and a low NF in a highest gain mode, and the ability to switch to one or more lower gain modes that achieve higher linearity. These system-level improvements are specifically enabled by the current invention and enable embodiments of the invention to meet the strict performance specifications of customers and a number of RF standards. The current invention is therefore critical to embodiments of the overall system shown in FIG. 10.

Methods

Figure 11:
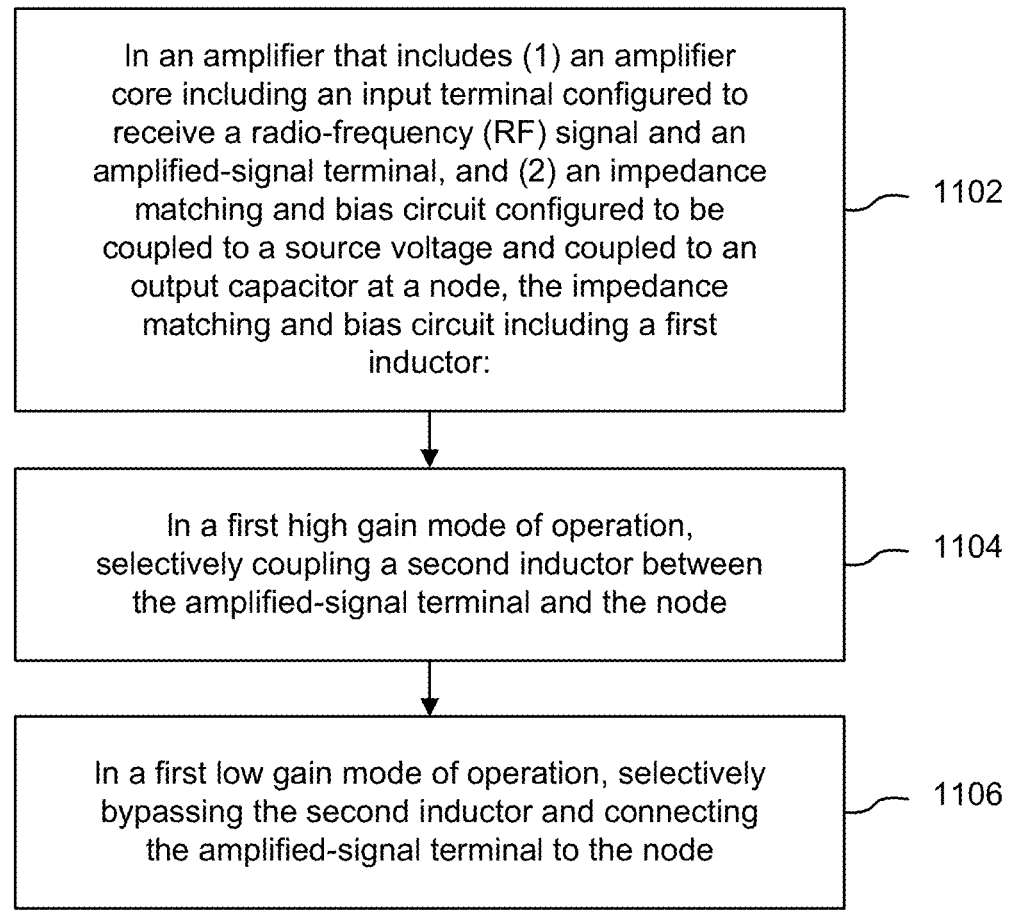
FIG. 11 is a process flow chart showing one method of achieving wideband output impedance matching and high gain while maintaining low power and a low noise factor in a highest gain mode, while allowing switching to one or more lower gain modes that achieve higher linearity, for an amplifier that includes (1) an amplifier core including an input terminal configured to receive a radio-frequency (RF) signal and an amplified-signal terminal, and (2) an impedance matching and bias circuit configured to be coupled to a source voltage and coupled to an output capacitor at a node, the impedance matching and bias circuit including a first inductor.

FIG. 11 is a process flow chart 1100 showing one method of achieving wideband output impedance matching and high gain while maintaining low power and a low noise factor in a highest gain mode, while allowing switching to one or more lower gain modes that achieve higher linearity, for an amplifier that includes (1) an amplifier core including an input terminal configured to receive a radio-frequency (RF) signal and an amplified-signal terminal, and (2) an impedance matching and bias circuit configured to be coupled to a source voltage and coupled to an output capacitor at a node, the impedance matching and bias circuit including a first inductor (Block 1102). The method includes: in a first high gain mode of operation, selectively coupling a second inductor between the amplified-signal terminal and the node (Block 1104); and in a first low gain mode of operation, selectively bypassing the second inductor and connecting the amplified-signal terminal to the node (Block 1106).

Additional aspects of the above method may include one or more of the following: wherein the impedance matching and bias circuit further includes at least one of a selectable resistor in parallel with the second inductor and/or a selectable capacitor in parallel with the second inductor; wherein in one or more low gain modes of operation, at least one of the selectable resistor or the selectable capacitor is enabled; wherein at least one of the selectable resistor or the selectable capacitor is adjustable; wherein at least one of the first inductor or the second inductor is adjustable; wherein the first inductor and the second inductor are implemented as an asymmetric T-coil; wherein the output capacitor is adjustable; further including coupling an input impedance matching circuit to the input terminal and configured to receive the RF signal; wherein the input impedance matching circuit includes a series inductor coupled to the input terminal and configured to receive the RF signal, and a shunt inductor coupled between the series inductor and a reference potential; wherein at least one of the series inductor or the shunt inductor is adjustable; wherein the amplifier core includes a degeneration terminal, and further including coupling a degeneration circuit to the degeneration terminal and to a reference potential, the degeneration circuit including a degeneration inductor; wherein the degeneration inductor includes a two-port coiled integrated circuit inductor; further including coupling a bypass switch in parallel with the degeneration inductor; wherein the amplifier core further includes a feedback node in an output signal path of the amplifier core, and further including coupling a feedback circuit between the input terminal and the feedback node and selectively switchable between enabled and disabled; wherein the feedback circuit includes a capacitor, a resistor, and switch coupled in series; wherein at least one of the resistor or capacitor is adjustable; wherein the amplifier is a low-noise amplifier; further including coupling a bias circuit to the amplifier core; wherein the amplifier is implemented as an integrated circuit fabricated in a silicon-on-insulator technology and includes MOS devices; wherein the amplifier is implemented as an integrated circuit assembled in a circuit module; wherein the amplifier is implemented as an integrated circuit comprising part of a communications device; and/or wherein the amplifier is implemented as an integrated circuit comprising part of a communications receiver or transmitter or transceiver.

Fabrication Technologies & Options

While the example embodiments shown in FIGS. 3A, 3B, and 4 are LNAs, the inventive circuits and methods may also be applied to other types of amplifiers, such as power amplifiers.

The switches shown in FIGS. 3A, 3B, and 4 may be implemented as FETs, particularly MOSFETs. The modes of operation of the multi-gain LNA circuits 300, 350 may be set by a control circuit (not shown) in known fashion. The control circuit may also connect to the components that are adjustable to select different component values (e.g., capacitance, resistance, inductance) for different gain states, for example, to help impedance matching or reduce gain in some modes of operation.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "lower", "upper", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS transistor devices, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An amplifier including:
   (a) an amplifier core including:
       (1) an input terminal configured to receive a radio-frequency (RF) signal; and
       (2) an amplified-signal terminal;
   (b) an output capacitor coupled to a node;
   (c) a multi-mode inductor circuit having a first terminal coupled to the amplified-signal terminal and a second terminal connected to the node, the multi-mode inductor circuit including:
       (1) a first inductor; and
       (2) a bypass switch coupled in parallel with the first inductor; and
   (d) an impedance matching and bias circuit configured to be coupled to a source voltage and directly connected to the node, the impedance matching and bias circuit including at least a second inductor;
   wherein in a first high gain mode of operation, the bypass switch is in an open state, thereby coupling the first inductor between the amplified-signal terminal and the node; and
   wherein in a first low gain mode of operation, the bypass switch is in a closed state, thereby bypassing the first inductor and coupling the amplified-signal terminal to the node.

2. The amplifier of claim 1, wherein the impedance matching and bias circuit further includes at least one of a selectable resistor in parallel with the second inductor and/or a selectable capacitor in parallel with the second inductor.

3. The amplifier of claim 2, wherein in one or more low gain modes of operation, at least one of the selectable resistor or the selectable capacitor is enabled.

4. The amplifier of claim 2, wherein at least one of the selectable resistor or the selectable capacitor is adjustable.

5. The amplifier of claim 1, wherein at least one of the first inductor or the second inductor is adjustable.

6. An amplifier including:
   (a) an amplifier core including:
       (1) an input terminal configured to receive a radio-frequency (RF) signal; and
       (2) an amplified-signal terminal;
   (b) an output capacitor coupled to a node;
   (c) a multi-mode inductor circuit having a first terminal coupled to the amplified-signal terminal and a second terminal connected to the node, the multi-mode inductor circuit including:
       (1) a first inductor; and
       (2) a bypass switch coupled in parallel with the first inductor; and
   (d) an impedance matching and bias circuit configured to be coupled to a source voltage and connected to the node, the impedance matching and bias circuit including at least a second inductor;
   wherein in a first high gain mode of operation, the bypass switch is in an open state, thereby coupling the first inductor between the amplified-signal terminal and the node;
   wherein in a first low gain mode of operation, the bypass switch is in a closed state, thereby bypassing the first inductor and coupling the amplified-signal terminal to the node; and
   wherein the first inductor and the second inductor are implemented as an asymmetric T-coil.

7. Amplifier of claim 1, wherein the output capacitor is adjustable.

8. The amplifier of claim 1, further including an input impedance matching circuit coupled to the input terminal and configured to receive the RF signal.

9. The amplifier of claim 8, wherein the input impedance matching circuit includes a series inductor coupled to the input terminal and configured to receive the RF signal, and a shunt inductor coupled between the series inductor and a reference potential.

10. The amplifier of claim 9, wherein at least one of the series inductor or the shunt inductor is adjustable.

11. The amplifier of claim 1, wherein the amplifier core includes a degeneration terminal, and further including a degeneration circuit coupled to the degeneration terminal and configured to be coupled to a reference potential, the degeneration circuit including a degeneration inductor.

12. The amplifier of claim 11, wherein the degeneration inductor includes a two-port coiled integrated circuit inductor.

13. The amplifier of claim 12, further including a bypass switch coupled in parallel with the degeneration inductor.

14. An amplifier including:
   (a) an amplifier core including:
       (1) an input terminal configured to receive a radio-frequency (RF) signal;
       (2) an amplified-signal terminal;
       (3) a feedback node in an output signal path of the amplifier core; and
       (4) a feedback circuit coupled between the input terminal and the feedback node and selectively switchable between enabled and disabled;
   (b) an output capacitor coupled to a node;
   (c) a multi-mode inductor circuit having a first terminal coupled to the amplified-signal terminal and a second terminal connected to the node, the multi-mode inductor circuit including:
       (1) a first inductor; and
       (2) a bypass switch coupled in parallel with the first inductor; and
   (d) an impedance matching and bias circuit configured to be coupled to a source voltage and coupled directly to the node, the impedance matching and bias circuit including at least a second inductor;

wherein in a first high gain mode of operation, the bypass switch is in an open state, thereby coupling the first inductor between the amplified-signal terminal and the node; and wherein in a first low gain mode of operation, the bypass switch is in a closed state, thereby bypassing the first inductor and coupling the amplified-signal terminal to the node.

15. The amplifier of claim 14, wherein the feedback circuit includes a capacitor, a resistor, and switch coupled in series.

16. The amplifier of claim 15, wherein at least one of the resistor or capacitor is adjustable.

17. The amplifier of claim 1, further including a bias circuit coupled to the amplifier core.

18. The amplifier of claim 1, wherein the amplifier is a low-noise amplifier.

19. The amplifier of claim 1, wherein the amplifier is implemented as an integrated circuit fabricated in a silicon-on-insulator technology and includes MOS devices.

20. The amplifier of claim 1, wherein the amplifier is implemented as an integrated circuit assembled in a circuit module.

21. The amplifier of claim 1, wherein the amplifier is implemented as an integrated circuit comprising part of a communications device.

22. The amplifier of claim 1, wherein the amplifier is implemented as an integrated circuit comprising part of a communications receiver or transmitter or transceiver.

* * * * *